United States Patent
Takenaka et al.

(10) Patent No.: US 6,625,251 B2
(45) Date of Patent: Sep. 23, 2003

(54) LASER PLASMA X-RAY GENERATION APPARATUS

(75) Inventors: Hisataka Takenaka, Tokyo (JP); Takayasu Mochizuki, Tokyo (JP)

(73) Assignee: NTT Advanced Technology Corporation, Tokyo (JP)

(*) Notice: Subject to any disclaimer, the term of this patent is extended or adjusted under 35 U.S.C. 154(b) by 0 days.

(21) Appl. No.: 10/101,386

(22) Filed: Mar. 18, 2002

(65) Prior Publication Data

US 2002/0136354 A1 Sep. 26, 2002

Related U.S. Application Data

(63) Continuation-in-part of application No. 09/668,840, filed on Sep. 22, 2000, now abandoned.

(51) Int. Cl.[7] .................................. G21K 1/06
(52) U.S. Cl. ..................... 378/84; 378/85; 378/145
(58) Field of Search .................... 378/33, 43, 84, 378/85, 143, 34, 145, 70, 82

(56) References Cited

U.S. PATENT DOCUMENTS

| | | | | |
|---|---|---|---|---|
| 5,022,064 A | * | 6/1991 | Iketaki | 378/145 |
| 5,052,033 A | * | 9/1991 | Ikeda et al. | 378/35 |
| 5,339,346 A | * | 8/1994 | White | 378/34 |
| 5,433,988 A | * | 7/1995 | Fukuda et al. | 428/141 |
| 6,014,252 A | * | 1/2000 | Shafer | 359/355 |
| 6,522,717 B1 | * | 2/2003 | Murakami et al. | 378/43 |

FOREIGN PATENT DOCUMENTS

JP 2614457 10/1989

OTHER PUBLICATIONS

Shimoura, A. et al., X–ray Generation in Cryogenic Target Irradiated by 1 μm Pulse Laser, Appl. Phys. Lett. 72: 164–166, Jan. 12, 1998.*

* cited by examiner

*Primary Examiner*—Drew A. Dunn
*Assistant Examiner*—Therese Barber
(74) *Attorney, Agent, or Firm*—Blakely, Sokoloff, Taylor & Zafman

(57) ABSTRACT

An x-ray generation apparatus includes an x-ray reflecting mirror and x-ray generation part. The x-ray reflecting mirror is formed on an inner surface of a concave aspheric surface. The x-ray generation part receives at least one incident energy beam. The x-ray generation part is arranged near a focal point including a focal point of a paraboloid, and the x-ray reflecting mirror has at least one aperture formed in a position except for a part of the concave aspheric surface crossing an axis including the focal point of the concave aspheric surface, and an incident energy beam irradiates the x-ray generation part through the aperture.

23 Claims, 4 Drawing Sheets

LASER PLASMA X-RAY GENERATION APPARATUS

CROSS-REFERENCE TO RELATED APPLICATIONS

This is a Continuation-In-Part of Ser. No. 09/668,840, filed on Sep. 22, 2000, now abandoned.

BACKGROUND OF THE INVENTION

The present invention relates to a laser plasma x-ray generation apparatus used for an x-ray reduction projection lithography apparatus, an apparatus for highly sensitively analyzing the chemical state, the chemical composition, and the concentration of an impurity, especially a light element, of various types of materials such as semiconductor materials, and the like.

A laser x-ray generation apparatus used in the application purpose described above generally is constituted to irradiate a target with x-rays from a laser plasma x-ray source, which is arranged at a remote position, through a reflecting mirror.

In this case, to improve the resolution, an x-ray source with a short wavelength is used. When, however, the wavelength is equal to or shorter than several hundred Å, the reflectance of the reflecting mirror is extremely lowered and practically becomes zero.

For example, as illustrated in FIG. 1, two kinds of substance layers 2 and 3 are reciprocally and regularly layered with constant thickness on a substrate 1 made of a material such as quartz or silicon, a direct incidence reflecting mirror (multilayer reflecting mirror) with high reflectance utilizing Bragg diffraction can be actualized.

Especially, since as high as sixty and some % of direct incidence reflectance of a soft x-ray with approximately 130 Å wavelength can be obtained using a Mo/Si multilayer film produced by regularly and reciprocally layering at least several ten Mo layers and Si layers with independently several nm thickness, such a multilayer film has widely been used for x-ray reduction exposure and for a reflecting mirror of an x-ray microscope, an astronomical telescope and the likes.

In this case, synchrotron (SR) radiation light, a laser plasma x-ray (LPX), and a gas pinch plasma (GPP) are employed as an x-ray source and among them, the synchrotron radiation light requires a large-scale and costly apparatus using an accelerator and the gas pinch plasma is a light source with luminance low by some figures, so that the laser plasma x-ray, which is a relatively compact and has luminance as high as $10^{12}$ w/cm$^2$, is expected to be a practically usable light source.

Nevertheless, as illustrated in FIG. 2, a target material and a fine particle are evaporated by using the laser x-ray source excited by pulsed laser light, so that if the evaporated material and particle adhere to an x-ray optical system, of which the x-ray reflecting mirror is representative, the function of the system is deteriorated.

In order to inhibit such deterioration, a mechanically synchronized shutter or a buffer gas is inserted between the laser x-ray source and the reflecting mirror or the reflecting mirror is positioned at a remote position for converging generated x-rays and using the converged x-rays.

However, in any case, since a reflecting mirror has to be positioned at a position far from a laser plasma x-ray source, which is a point source, the reflecting mirror has a disadvantageous point of a low use coefficient of x-rays and its practical application has been hindered.

Note that, in FIG. 2, 21 shows an incidence laser, 22 shows a target, 23 shows the reflected rays which are created when the incidence laser 21 is reflected by the target 22, 24 shows a carbon thin film-like filter, 25 shows a reflecting mirror, 25a shows a reflecting surface, and 26 shows debris.

FIGS. 3A and 3B independently illustrate a constitution example of a conventional laser plasma x-ray generation apparatus, and represent a paraboloid of revolution and an ellipsoid of revolution used as light concentration reflecting mirrors, respectively. Since a reflecting mirror with a surface of revolution is used in these constitutions, a condensing solid angle used for condensing x-rays from a laser plasma x-ray source serving as a point source is larger than that in FIG. 2. However, laser light is incident on the reflecting mirror along the rotation axis of the reflecting mirror, so that, as will be described later, relatively intense x-rays irradiated in a direction of a normal (vertical direction) to a target material run outside through an aperture which is made on the rotation axis for laser incidence. Alternately, even if the x-rays are reflected by the rotating reflecting mirror, a target material 32 with a finite size reabsorbs the x-rays. Therefore, this poses a problem of low light concentration efficiency.

On the other hand, it has been required to use a soft x-ray with wavelength shorter than approximately 130 Å in order to further improve the resolution in those application cases. Nevertheless, in the case a Mo/Si multilayer film is used at wavelength 124 Å (L absorption edge of Si) or shorter, the direct incidence reflectance is considerably lowered on the order of several to about ten % to make it impossible to practically use the multilayer film at the wavelength.

A reflecting surface using Mo in combination with B4C has been proposed in order to increase the reflectance of the reflecting surface 25a, and even such a surface can provide reflectance 30% at the highest and has been unsuitable for practical use.

Recently, the multilayer structure type reflecting surface 25a comprising reciprocally layered Mo and Be layers has been proposed and it is found that higher than 60% of direct incidence reflectance of wavelength just at absorption edge of Be (just at 111 Å) can be obtained by the multilayer film type x-ray reflecting mirror and resolution improvement is expected to be achieved by obtaining high reflectance even of a soft x-ray with a short wavelength in the foregoing application.

Also recently, a cryotarget is invented (Patent No. 2614457) using a chemically inert rare gas element in a liquid or solid state at a low temperature or in a low temperature gas state at vapor density near that in liquid state as a target material irradiated with laser light, thereby eliminating adhesion of the target particle to an x-ray optical system such as a reflecting mirror or others. It can be said that practical application of laser plasma x-ray source (LPX) is just started.

Normally, since a plurality of multilayer reflecting mirrors are employed in an x-ray image-forming optical system as illustrated in FIG. 1, the x-ray concentration and transmittance is generally considerably lowered. For that, each reflecting mirror is required to have a reflectance higher even by a little.

In the case of Mo/Be combination, when a film is actually formed, the interfaces or respective layers become rather rough since Mo and Be are aggregated and owing to the effect of the roughness, there occurs a problem that the actual reflectance is lower than the theoretical reflectance of the multilayer film with an ideal structure by about 20%.

Further, in the case of Mo/Be combination, since the melting point of Be is as low as about 1270° C., the reflectance is sharply decreased by use of soft x-rays with high luminance and by increase of the ambient temperature to be high just like the case of the Mo/Si multilayer film type x-ray reflecting mirror and there also occurs a problem of insufficient heat resistance for stable use. Moreover, since the reflectance is extremely lowered at 111 Å or shorter wavelength in the case of a multilayer film x-ray reflecting mirror using Mo and Be in combination, there occurs another problem that the reflecting mirror can not be usable at the wavelength or shorter.

On the other hand, it was found by Mochizuki, one of inventors of the present invention, that a Xe (xenon) cryotarget laser plasma x-ray source, which is a typical cryotarget, has the most intense emission spectrum near 108 Å wavelength (A. Shimoura, S. Amano, S. Miyamoto, and T. Mochizuki, "X-ray generation in cryogenic targets irradiated by 1 µm pulse laser", Applied Physics Letters 72, PP. 164–166 (1998)). So far, there exits no reflecting mirror capable of providing sufficiently high reflectance (50% or higher) at the wavelength. Furthermore, though a reflecting mirror having a long life with stable and high reflectance even if being exposed to scattered laser light from intense x-rays and plasma has been required in order to effectively utilize the utmost advantage of using cryotarget, that is, the advantageous characteristic that a reflecting mirror can be positioned in the periphery of a radiation source since adhesion of the target particle can be avoided and that a light concentration optical system having a three-dimensional and wide light concentrating angle can be constituted, any conventional reflecting mirror can not satisfy such requirements.

SUMMARY OF THE INVENTION

A main purpose of the present invention is, therefore, to provide a practical laser plasma x-ray generation apparatus with high luminance which uses a light concentration optical system having high light concentration efficiency.

Another purpose of the present invention is, in addition to the foregoing purpose, to provide a laser plasma x-ray generation apparatus which can increase heat resistance further than that in any conventional laser plasma x-ray generation apparatus.

Further, another purpose of the present invention is to provide a laser plasma x-ray generation apparatus using a reflecting surface capable of suppressing reflectance alteration during the use.

Moreover, another purpose of the present invention is to provide a laser plasma x-ray generation apparatus with a longer life than that of any conventional laser plasma x-ray generation apparatus.

In order to achieve the foregoing purposes, the basic concepts of the present invention are characterized in that (1) Ru or Rh is used as a material for one type of layers and Be is used for the other type of layers, and (2) a material containing a light element such as B, C, O, N and the likes added to a compound of metals or a single metal as a material for one type of layers.

The means was derived from that the reflectance was improved by 4% when a multilayer film was produced by using Rh instead of Mo in a Mo/Be multilayer film in order to improve the reflectance and then the reflectance of the film was measured at 115 Å. That implied the possibility of existence of a material with a more suitable optical constant than that of Mo. It is, therefore, possible to heighten the x-ray reflectance by using Ru, which is a material with an optical constant more suitable than that of Mo at about the wavelength and further by using a Mo alloy with Ru or Rh and a Ru and Rh alloy instead of Mo.

In addition to that, though the reflectance greatly depends on the optical constant, the actual reflectance tends to be decreased as compared with a theoretical value in the case the roughness of the boundary faces of a multilayer film becomes high. On the other hand, an alloy containing an element such as B, C, O, and N is generally easy to be an amorphous layer when the alloy is formed into an extremely thin layer with a thickness several nm to several tens nm, and being amorphous, the layer of the alloy has smoother boundary faces than a monolayer of an alloy and a metal. Consequently, in the case such an alloy containing those elements instead of Mo, the effect for heightening the reflectance can be taken. For that, in the case a multilayer film comprising such a material used for one type of layers and Be for the other type of layers is employed (1) for application to various analysis utilizing x-rays and soft x-rays, the sensitivity and the precision can be improved owing to the improvement of the reflectance of the multilayer film as compared with that of a multilayer film using Mo layers for layers other than Be layers and in the case of employing the multilayer film (2) for application to x-ray lithography, the throughput can be improved as compared with a multilayer film using Mo for layers other than Be layers owing to the same reason as that for the case of (1).

Moreover, in general, a material containing other elements such as B, C, O, and N added to or compounded with metals including Be frequently has a higher melting point than a single metal and interlayer diffusion can thus be suppressed. Therefore, if such materials are used for constituent materials for the multilayer film, the heat resistance is improved and in the case the multilayer film produced using such materials is employed (1) for application to various analyses utilizing x-rays and soft x-rays, the heat resistance can be improved as compared with that of a conventional multilayer film type reflecting mirror, so that the reflectance alteration during the use is suppressed as compared with a conventional reflecting mirror and the precision and accuracy can be improved and in the case of using the multilayer film (2) for application to x-ray lithography, the proper exposure duration can precisely be determined owing to the same reason as that for the case of (1) and further (3) the life of the multilayer film itself can be prolonged.

Since a sufficiently high reflectance (50%) of even near 108A wavelength can be obtained by a reflecting mirror of the present invention, the present invention can actualize a light concentrating optical system with high efficiency and a long life especially for a laser plasma x-ray source using a cryotarget. Especially, the present invention can heighten the throughput of a reduction projection lithography to a practically usable level.

BRIEF DESCRIPTION OF THE DRAWINGS

FIGS. 3A and 3B independently illustrate a constitution example of the conventional laser plasma x-ray generation apparatus, in which FIG. 3A is a side sectional view of a paraboloid of revolution, and FIG. 3B is a side sectional view of an ellipsoid of revolution; and FIGS. 3C, 3D, 3E, and 3F independently illustrate a basic constitution of an ellipsoid of revolution using a multilayer film type x-ray reflecting mirror characterized by the present invention, in which FIG. 3C is a side sectional view, FIG. 3D is a cross-sectional view, FIG. 3E is a view illustrating, while illustrating the whole shape of the ellipsoid of revolution, a relationship between the ellipsoid of revolution and an incidence laser which is incident on the reflecting mirror, and FIG. 3F illustrates a modification of the present invention.

DESCRIPTION OF THE PREFERRED EMBODIMENT

Hereafter, an embodiment of the present invention will be described with reference to examples.

In the following description, terms "ellipsoidal surface", "ellipsoid of revolution", "paraboloid", and "paraboloid of revolution" are used. A paraboloid is obtained by making one of two focal points of an ellipsoid infinity. Note that, in the description from the another view point, a quadratic surface of revolution having a form obtained by rotating, using an x-axis (optical axis) as a center, a quadratic curve represented by a quadratic equation for orthogonal coordinates (x, y)

$$ax^2+2hxy+by^2+2gx+sfy+c=0$$

(where each of a, b, c, f, g, and h is constant) is defined as an "ellipsoidal surface", "ellipsoid of revolution", "paraboloid", or "paraboloid of revolution". An ellipse is represented by $h2-ab<0$, and a parabola is represented by $h2-ab=0$.

EXAMPLE 1

Figure 1:
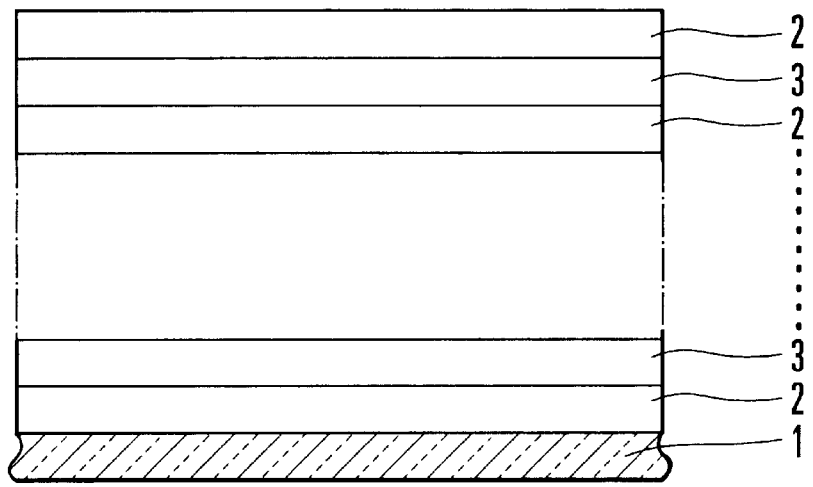
FIG. 1 illustrates the structure of a multilayer film type x-ray reflecting mirror used for a laser plasma x-ray generation apparatus.
Figure 2:
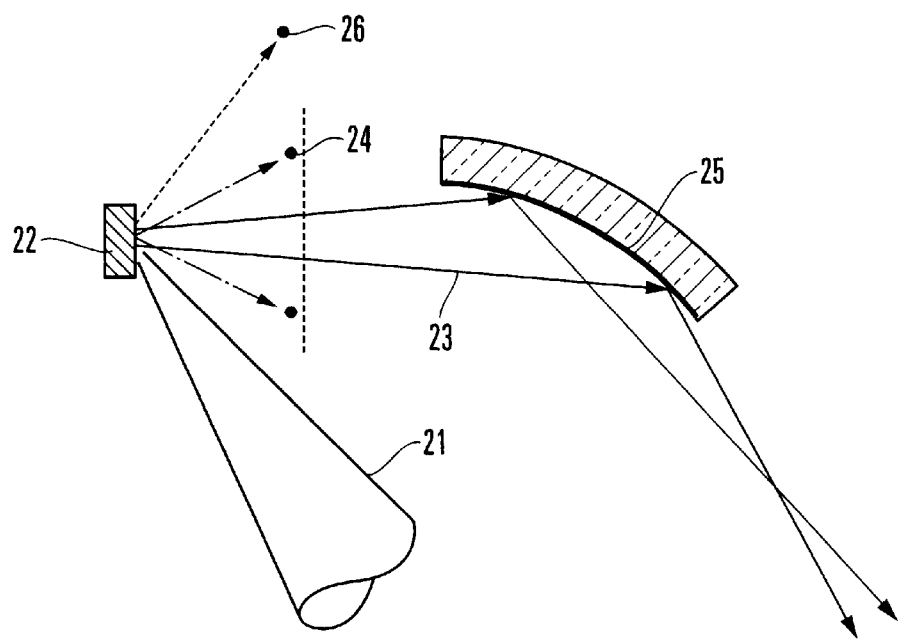
FIG. 2 is the constitution of a conventional laser plasma x-ray generation apparatus.

Using a RF magnetron sputtering apparatus provided with a plurality of raw material targets, multilayer films each comprising repeatedly layered Mo layers (correspond to 2 of FIG. 1) and Be layers (correspond to 3 of FIG. 1) were produced on a substrate (corresponds to 1 of FIG. 1) by evacuating a film formation chamber to $10^{-8}$ torr level, introducing Ar gas into the resultant film formation chamber to keep the inside of the film formation chamber in Ar atmosphere of $3\times10^{-8}$ torr pressure, and then generating electric discharge. The number of the pairs of the Mo layers and Be layers was controlled to be 40 and the cycle length was controlled to be 6 nm. The ratio of the thickness dMo of Mo to the sum thickness (the cycle length D) of a single Mo layer and a single Be layer was changed in a range of 10 to 90%. The correlation of the reflectance of the multilayer films with the wavelength was measured using a reflectance meter employing photon radiation and the results of the measurement were showed in the table 1.

In the case the thickness of a Mo layer was 50% to the cycle length, the reflectance reached the maximum, which was 62%. The reflectance was as high as 40% or higher in the case the thickness was in a range 20 to 70% to the cycle length.

TABLE 1

| dMo/D (%) | 10 | 20 | 30 | 40 | 50 | 60 | 70 | 80 | 90 |
|---|---|---|---|---|---|---|---|---|---|
| The maximum reflectance | 14 | 42 | 52 | 58 | 62 | 55 | 48 | 39 | 15 |

(measurement conditions: direct incident angle (the inclination angle from the normal of a multilayer film) 3°, peak wavelength near 114 Å).

EXAMPLE 2

Multilayer films comprising repeatedly layered Mo—N layers (correspond to 2 of FIG. 1) containing 5 atomic % (at. %) of N and Be—N layers (correspond to 3 of FIG. 1) containing 5 at. % of N were produced on a substrate (corresponds to 1 of FIG. 1) in the same manner as that for the example 1. It should be noted that the at. % is the percentage of an element included in an object based on the number of atoms. For example, in $H_2O$ (water), since the molecule has two hydrogen atoms and one oxygen atom, the percentage of the oxygen atoms is calculated by 1/(1+2)*100=33. Thus, water contains 33 at. % oxygen atoms. The multilayer films were produced while the number of the pairs of the Mo—N layers and Be—N layers being controlled to be 40 and 80 and the cycle length being controlled to be 6 nm and 5.6 nm, respectively. The ratio of the thickness dMo—N of Mo to the sum thickness D of one Mo—N layer and one Be—N layer was changed within a range of 10 to 90%.

The correlation of the reflectance of the multilayer films with the wavelength was measured using a reflectance meter in the same manner as that for the example 1 and the multilayer film with cycle length 6 nm showed 69% reflectance of soft x-rays with 114 Å wavelength in the case the thickness of a Mo—N layer was 50% to the cycle length and as same as that of the example 1, the reflectance was as high as 45% or higher in the case the thickness of a Mo—N layer was in a range 20 to 70% to the cycle length. Further, the multilayer film with cycle length 6 nm showed 55% reflectance of soft x-rays with 108 Å wavelength in the case the thickness of a Mo—N layer was 55% to the cycle length and as same as that of the example 1, the reflectance of the ray with 110 Å or shorter wavelength was as high as 45% or higher, which had not been achieved before, in the case the thickness of a Mo—N layer was in a range from 45 to 70% to the cycle length.

EXAMPLE 3

In the same manner as that for the example 1, using Rh for one type of layers (correspond to 2 of FIG. 1) and Be for the other type of layers (correspond to 3 of FIG. 1), multilayer films comprising repeatedly formed layers of these elements were produced on a substrate (corresponds to 1 of FIG. 1) by sputtering method. The number of the pairs of the Rh layers and Be layers was controlled to be 40 and the cycle length was controlled to be 6 nm. The ratio of the thickness dRh of Rh to the sum thickness (the cycle length D) of a single Rh layer and a single Be layer was changed within a range of 10 to 70%. The correlation of the reflectance of the multilayer films with the wavelength was measured using a reflectance meter employing photon radiation and the results of the measurement were showed in the table 2.

In the case the thickness of a Rh layer was 30% to the cycle length, the reflectance reached the maximum, which was 65%. The reflectance was relatively high, not lower than 30%, in the case the thickness of a Rh layer was within a range 20 to 70% to the cycle length and was considerably high, not lower than 55%, in the case the thickness of a Rh layer was within a range 20 to 40%.

TABLE 2

| dMo/D (%) | 10 | 20 | 30 | 40 | 50 | 60 | 70 |
|---|---|---|---|---|---|---|---|
| The maximum reflectance | 25 | 55 | 65 | 58 | 50 | 43 | 31 |

(measurement conditions: direct incident angle (the inclination angle from the normal of a multilayer film) 3°, peak wavelength near 114 Å).

EXAMPLE 4

In the same manner as that for the example 1, using Ru for one type of layers (correspond to 2 of FIG. 1) and Be for the other type of layers (correspond to 3 of FIG. 1), multilayer films comprising repeatedly formed layers of these elements were produced on a substrate (corresponds to 1 of FIG. 1) by sputtering method. The number of the pairs of the Rh layers and Be layers was controlled to be 40 and the cycle length was controlled to be 6 nm. The ratio of the thickness dRu of Ru to the sum thickness (the cycle length D) of a single Ru layer and a single Be layer was changed within a range of 10 to 90%. The correlation of the reflectance of the multilayer films with the wavelength was measured using a reflectance meter employing photon radiation and the results of the measurement were showed in the table 3.

In the case the thickness of a Ru layer was 50% to the cycle length, the reflectance reached the maximum, which was 67%. The reflectance was as high as 50% or higher in the case the thickness of a Ru layer was within a range 30 to 70% to the cycle length and was considerably high, not lower than 55%, in the case the thickness of a Ru layer was within a range 30 to 60%.

TABLE 3

| dMo/D (%) | 10 | 20 | 30 | 40 | 50 | 60 | 70 | 80 | 90 |
|---|---|---|---|---|---|---|---|---|---|
| The maximum reflectance | 15 | 42 | 53 | 62 | 67 | 58 | 52 | 40 | 14 |

(measurement conditions: direct incident angle (the inclination angle from the normal of a multilayer film) 3°, peak wavelength near 114 Å).

EXAMPLE 5

In the same manner as that for the example 1, using Mo—Rh alloys for one type of layers and Be for the other type of layers, multilayer films comprising repeatedly formed layers of these substances were produced on a substrate by sputtering method. The number of the pairs of the Mo—Rh layers and Be layers was controlled to be 40 and the cycle length was controlled to be 6 nm. The multilayer films were produced while the ratio of the thickness dMo—Rh of a Mo—Rh layer to the cycle length being changed within a range of 10 to 90% and the composition ratio of Mo and Rh being changed within a range of 10 to 90%.

The correlation of the reflectance of the multilayer films with the wavelength was measured in the same manner as that f or the example 1 and it was found that the multilayer films having the composition ratio of Rh in the Mo—Rh alloys within a range 30 to 70% and dMo—Rh/D within a range of 30 to 70% showed a considerably high reflectance, which exceeds 60%, in the condition that the direct incident angle (the inclination angle from the normal of the multilayer films) was 3° and peak wavelength was near 114 Å. Especially, in the case that the composition ratio Rh in the Mo—Rh alloys was 50% and dMo—Rh/D was 45%, the above defined reflectance was as high as 72%.

EXAMPLE 6

In the same manner as that for the example 1, using Mo—Ru alloys for one type of layers and Be for the other type of layers, multilayer films comprising repeatedly formed layers of these substances were produced by sputtering method. The number of the pairs of the Mo—Ru layers and Be layers was controlled to be 40 and the cycle length was controlled to be 6 nm. The multilayer films were produced while the ratio of the thickness dMo—Ru of a Mo—Ru layer to the cycle length being changed within a range of 10 to 90% and the composition ratio of Mo and Ru being changed within a range of 10 to 90%.

The correlation of the reflectance of those multilayer films with the wavelength was measured in the same manner as that for the example 1 and it was found that the multilayer films having the composition ratio of Ru in the Mo—Ru alloys within a range 30 to 70% and dMo—Ru/D within a range of 30 to 70% showed a considerably high reflectance, which exceeds 60%, in the condition that the direct incident angle (the inclination angle from the normal of the multilayer films) was 3° and peak wavelength was in a wide range from near 112 Å to near 117 Å. Especially, in the case that the composition ratio Ru in the Mo—Ru alloys was 50% and dMo—Ru/D was 40%, the above defined reflectance was as high as 72%.

EXAMPLE 7

In the same manner as that for the example 1, using Ru—Rh alloys for one type of layers and Be for the other type of layers, multilayer films comprising repeatedly formed layers of these substances were produced by sputtering method. The number of the pairs of the Ru—Rh layers and Be layers was controlled to be 40 and the cycle length was controlled to be 6 nm. The multilayer films were produced while the ratio of the thickness of a Ru—Rh layer to the cycle length being changed within a range of 10 to 90% and the composition ratio of Ru and Rh being changed within a range of 10 to 90%.

The correlation of the reflectance of those multilayer films with the wavelength was measured in the same manner as that for the example 1 and it was found that the multilayer films having the composition ratio of Rh in the Ru—Rh alloys within a range 30 to 70% and dRu—Rh/D within a range of 10 to 60% showed a considerably high reflectance, which exceeds 60%, in the condition that the direct incident angle was 3° and peak wavelength was near 113 Å. Especially, in the case that the composition ratio Ru in the Ru—Rh alloys was 50% and dRu—Rh/D was 25%, the above defined reflectance was as remarkable high as 78%.

EXAMPLE 8

In the same manner as that for the example 1, using Mo for one type of layers and B—Be compounds for the other type of layers, multilayer films comprising repeatedly formed layers of these substances were produced. The number of the pairs of the Mo layers and B—Be compound layers was controlled to be 60 and the cycle length was controlled to be 6 nm. The composition ratio of B and Be in the B—Be compound layers was changed within a range of 20 to 90% and the ratio of the thickness dMo of a Mo layer to the cycle length D was changed within a range of 10 to 90%. The correlation of the reflectance of thus produced multilayer films with the wavelength was measured in the same manner as that for the example 1 and it was found that the multilayer films having dMo/D within a range 30 to 70% showed a relatively high reflectance, which exceeds 50%, at the direct incident angle of 3° and peak wavelength near 115 Å. Especially, in the case that $B_2Be$ and $B_6Be$ were used as the Be compounds, the maximum reflectance was over 60%. Further, in the case those multilayer films were heated at 400° C. for 1 hour in vacuum of $10^{-5}$ torr and then the reflectance measurement was carried out in the same manner as that before heating, the decrease of reflectance was 5 to 18% to show excellent heat resistance. Especially, in the case of using $B_2Be$ and $B_6Be$, the decrease of reflectance was as low as 5 to 9% to show excellent heat resistance.

Reference 1

After the same heating treatment as that for the example 8 was carried out for a Mo/Be multilayer film produced by the example 1, the same reflectance measurement was carried out as that before heating and the reflectance was found decreasing by 45% as compared with that before heating.

EXAMPLE 9

In the same manner as that for the example 1, using Mo—Rh alloys for one type of layers and B—Be compounds for the other type of layers, multilayer films comprising repeatedly formed layers of these substances were produced.

The number of the pairs of the Mo—Rh layers and B—Be compound layers was controlled to be 60 and the cycle length was controlled to be 6 nm. The composition ratio of Rh in the Mo—Rh alloys was changed within a range of 30 to 70%, the composition ratio of B and Be in the B—Be compound layers was changed within a range of 20 to 90% and the ratio of the thickness Mo—Rh of a Mo—Rh layer to the cycle length D was changed within a range of 30 to 70%. The correlation of the reflectance of thus produced multilayer films with the wavelength was measured in the same manner as that for the example 1 and it was found that the multilayer films having the composition ratio of Rh in the Mo—Rh alloys within 30 to 70%, the thickness dMo—Rh/D within a range 40 to 60%, and the composition ratio of B in the B—Be compounds within 30 to 90% showed a relatively high reflectance, which exceeds 50%, at the direct incident angle of 3° and peak wavelength near 114 Å. Further, in the case those multilayer films were heated at 400° C. for 1 hour in vacuum of $10^{-5}$ torr and then the reflectance measurement was carried out in the same manner as that before heating, the decrease of reflectance was 5 to 20% to show higher heat resistance than that of a Mo/Be multilayer film.

EXAMPLE 10

In the same manner as that for the example 1, using Mo—Ru alloys for one type of layers and B—Be compounds for the other type of layers, multilayer films comprising repeatedly formed layers of these substances were produced.

The number of the pairs of the Mo—Ru layers and B—Be compound layers was controlled to be 60 and the cycle length was controlled to be 6 nm. The composition ratio of Ru in the Mo—Ru alloys was changed within a range of 30 to 70%, the composition ratio of B and Be in the B—Be compound layers was changed within a range of 20 to 90% and the ratio of the thickness dMo—Ru of a Mo—Ru layer to the cycle length D was changed within a range of 30 to 70%. The correlation of the reflectance of thus produced multilayer films with the wavelength was measured in the same manner as that for the example 1 and it was found that the multilayer films having the composition ratio of Ru in the Mo—Ru alloys within 30 to 70%, dMo—Ru/D within a range 40 to 60%, and the composition ratio of B in the B—Be compounds within 30 to 90% showed a relatively high reflectance, which exceeds 50%, at the direct incident angle of 3° and peak wavelength near 114 Å. Further, in the case those multilayer films were heated at 400° C. for 1 hour in vacuum of $10^{-5}$ torr and then the reflectance measurement was carried out in the same manner as that before heating, the decrease of reflectance was 5 to 22% to show higher heat resistance than that of a Mo/Be multilayer film.

EXAMPLE 11

In the same manner as that for the example 1, using Rh—Ru alloys for one type of layers and B—Be compounds for the other type of layers, multilayer films comprising repeatedly formed layers of these substances were produced.

The number of the pairs of the Rh—Ru layers and B—Be compound layers was controlled to be 60 and the cycle length was controlled to be 6 nm. The composition ratio of Ru in the Rh—Ru alloys was changed within a range of 30 to 70%, the composition ratio of B and Be in the B—Be compound layers was changed within a range of 20 to 90% and the ratio of the thickness dRh—Ru of a Rh—Ru layer to the cycle length D was changed within a range of 10 to 60%.

The correlation of the reflectance of thus produced multilayer films with the wavelength was measured in the same manner as that for the example 1 and it was found that the multilayer films having the composition ratio of Ru in the Rh—Ru alloys within 30 to 70%, dRh—Ru/D within a range 20 to 40%, and the composition ratio of B in the B—Be compounds within 30 to 90% showed a relatively high reflectance, which exceeds 60%, at the direct incident angle of 3° and peak wavelength near 114 Å. Further, in the case those multilayer films were heated at 400° C. for 1 hour in vacuum of $10^{-5}$ torr and then the reflectance measurement was carried out in the same manner as that before heating, the decrease of reflectance was 5 to 24% to show higher heat resistance than that of a Mo/Be multilayer film.

EXAMPLE 12

Using Rh—Ru alloys containing C for one type of layers and Be for the other type of layers, multilayer films comprising repeatedly formed layers of these substances were produced by a sputtering method in the same manner as that for the example 1. The number of the pairs of the C-containing Ru—Rh layers and Be layers was controlled to be 40 and the cycle length was controlled to be 6 nm, and also the number of pairs to be 80 and the cycle length to be 5.6 nm. The multilayer films were produced while the ratio of the thickness of a C-containing Ru—Rh layer to the cycle length D being controlled to be 25% and the composition of Ru and Rh to be 50%.

The correlation of the reflectance of thus produced multilayer films with the wavelength was measured in the same manner as that for the example 1 and it was found that the multilayer films having the composition ratio of C in the C-containing Ru—Rh alloys within 2 to 20% and the cycle length of 6 nm showed a high reflectance, which exceeds 55%, at the direct incident angle of 3° and peak wavelength near 113 Å and those having the cycle length of 5.6 nm showed a reflectance of 53% at 108 Å wavelength. Further, in the case those multilayer films were heated at 400° C. for 1 hour in vacuum of $10^{-5}$ torr and then the reflectance measurement was carried out in the same manner as that before heating, the decrease of reflectance was 4 to 14% to show excellent heat resistance.

EXAMPLE 13

Using Rh—Ru alloys containing B for one type of layers and Be for the other type of layers, multilayer films comprising repeatedly formed layers of these substances were produced by a sputtering method in the same manner as that for the example 1. The number of the pairs of the B-containing Ru—Rh layers and Be layers was controlled to be 40 and the cycle length was controlled to be 6 nm. The multilayer films were produced while the ratio of the thickness of a B-containing Ru—Rh layer to the cycle length being controlled to be 25% and the composition of Ru and Rh to be 50%.

The correlation of the reflectance of thus produced multilayer films with the wavelength was measured in the same manner as that for the example 1 and it was found that the multilayer films having the composition ratio of B in the B-containing Ru—Rh alloys within 1 to 20% showed a high reflectance, which exceeds 55%, at the direct incident angle of 3° and peak wavelength near 113 Å. Further, in the case those multilayer films were heated at 400° C. f or 1 hour in vacuum of $10^{-5}$ torr and then the reflectance measurement was carried out in the same manner as that before heating, the decrease of reflectance was 7 to 20% to show excellent heat resistance as compared with that of a Mo/Be multilayer film.

EXAMPLE 14

Using Rh—Ru alloys containing O for one type of layers and Be for the other type of layers, multilayer films comprising repeatedly formed layers of these substances were produced by a sputtering method in the same manner as that for the example 1. The number of the pairs of the O-containing Ru—Rh layers and Be layers was controlled to be 40 and the cycle length was controlled to be 6 nm. The multilayer films were produced while the ratio of the thickness of an O-containing Ru—Rh layer to the cycle length being controlled to be 25% and the composition of Ru and Rh to be 50%.

The correlation of the reflectance of thus produced multilayer films with the wavelength was measured in the same manner as that for the example 1 and it was found that the multilayer films having the composition ratio of O in the O-containing Ru—Rh alloys within 2 to 20% showed a high reflectance, which exceeds 55%, at the direct incident angle of 3° and peak wavelength near 113 Å. Further, in the case those multilayer films were heated at 40° C. for 1 hour in vacuum of $10^{-5}$ torr and then the reflectance measurement was carried out in the same manner as that before heating, the decrease of reflectance was 6 to 17% to show excellent heat resistance as compared with that of a Mo/Be multilayer film.

EXAMPLE 15

Using Rh—Ru alloys containing N for one type of layers and Be for the other type of layers, multilayer films comprising repeatedly formed layers of these substances were produced by a sputtering method in the same manner as that for the example 1. The number of the pairs of the N-containing Ru—Rh layers and Be layers was controlled to be 40 and the cycle length was controlled to be 6 nm. The multilayer films were produced while the ratio of the thickness of a N-containing Ru—Rh layer to the cycle length being controlled to be 25% and the composition of Ru and Rh to be 50%.

The correlation of the reflectance of thus produced multilayer films with the wavelength was measured in the same manner as that for the example 1 and it was found that the multilayer films having the composition ratio of N to Ru—Rh in the N-containing Ru—Rh alloys within 2 to 20% showed a high reflectance, which exceeds 55%, at the direct incident angle of 3° and peak wavelength near 113 Å. Further, in the case those multilayer films were heated at 400° C. for 1 hour in vacuum of $10^{-5}$ torr and then the reflectance measurement was carried out in the same manner as that before heating, the decrease of reflectance was 6 to 16% to show excellent heat resistance.

EXAMPLE 16

Using Mo containing C for one type of layers and Be for the other type of layers, multilayer films comprising repeatedly formed layers of these substances were produced by a sputtering method in the same manner as that for the example 1. The number of the pairs of the C-containing Mo layers and Be layers was controlled to be 40 and the cycle length was controlled to be 6 nm. The multilayer films were produced while the ratio of the thickness of a C-containing Mo layer to the cycle length being controlled to be 40%.

The correlation of the reflectance of thus produced multilayer films with the wavelength was measured in the same manner as that for the example 1 and it was found that the multilayer films having the composition ratio of C in the C-containing Mo within 2 to 20% showed a high reflectance, which exceeds 55%, at the direct incident angle of 3° and peak wavelength near 113 Å. Further, in the case those multilayer films were heated at 400° C. for 1 hour in vacuum of $10^{-5}$ torr and then the reflectance measurement was carried out in the same manner as that before heating, the decrease of reflectance was 1 to 9% to show excellent heat resistance.

EXAMPLE 17

Using Rh—Ru alloys for one type of layers and Be to which Ca, Co, Fe, Mo, Nb, Ti, V and W were independently added for the other type of layers, multilayer films comprising repeatedly formed layers of these substances were produced by a sputtering method in the same manner as that for the example 1. The number of the pairs of the Ru—Rh alloy layers and Be layers was controlled to be 40 and the cycle length was controlled to be 6 nm. The multilayer films were produced while the ratio of the thickness of a Ru—Rh layer to the cycle length being controlled to be 25% and the composition of Ru and Rh to be 50%.

The correlation of the reflectance of thus produced multilayer films with the wavelength was measured in the same manner as that for the example 1 and it was found that the multilayer films having the composition ratio of each additive in the Be layers containing independently one of Ca, Co, Fe, Mo, Nb, Ti, V and W within 1 to 33% showed a high reflectance, which exceeds 50%, at the direct incident angle of 3° and peak wavelength near 113 Å. Further, in the case those multilayer films were heated at 400° C. for 1 hour in vacuum of $10^{-5}$ torr and then the reflectance measurement was carried out in the same manner as that before heating, the decrease of reflectance was 7 to 18% to show excellent heat resistance.

EXAMPLE 18

In the same manner as that for the example 1, using Ru for one type of layers and $B_6Be$ for the other type of layers, multilayer films comprising repeatedly formed layers in 40 pairs of Ru layers and $B_6Be$ layers and having the cycle length within 3.9 to 7 nm at every 2 Å were produced.

The ratio of the thickness of layers was controlled to be 1:1. The correlation of the reflectance of thus produced multilayer films to the wavelength was measured in the same manner as that for the example 1 and it was found that a multilayer film type reflecting mirror comprising a multilayer film constituted of those layers in combination had a reflectance as high as 25% even to radiation about 78 Å peak wavelength corresponding to the cycle length at direct incident angle 3°, which was extremely high reflectance in such a wavelength region, further the reflectance was 35% to 100 Å wavelength, 57% to 114 Å wavelength, and at least 45% to radiation with wavelength in a range from 78 Å, the wavelength longer than the foregoing value, to 140 Å.

EXAMPLE 19

In the same manner as that for the example 1, using Ru for one type of layers and B for the other type of layers, multilayer films having a repeated structure of these two layers were produced by the sputtering method. The multilayer films were produced while the number of the pairs of Ru layers and B layers being controlled to be 60 and the cycle length to be 5.1 nm or 5.5 nm.

The ratio of the Ru thickness to the sum thickness of a single Ru layer and a single B layer was changed in a range of 10 to 90% and the correlation of the reflectance of the multilayer films with the wavelength was measured using a soft x-ray reflectance meter in the same manner as that for the example 1. In the case of 5.1 nm cycle length, the reflectance reached the maximum, which was 52%, to the soft x-ray wavelength of 100 Å when the thickness of a Ru layer was 45% to the cycle length. The reflectance was relatively high, 35% or higher, in the case the thickness of a Ru layer to the cycle length was in a range 30 to 60% to the cycle length and was 45% or higher, which was extremely high to the wavelength, in the case the thickness of a Ru layer to the cycle length was in a range 40 to 50%. On the other hand, in the case of 5.5 nm cycle length, the reflectance reached the maximum, which was 58%, to the soft x-ray wavelength of 108 Å when the thickness of a Ru layer was 45% to the cycle length. The reflectance was relatively high, 40% or higher, in the case the thickness of a Ru layer to the cycle length was in a range 30 to 60% to the cycle length and was 50% or higher, which was extremely high to the wavelength, in the case the thickness of a Ru layer to the cycle length was in a range 40 to 50%.

EXAMPLE 20

In the same manner as that for the example 18, using Ru containing 5 at. % of N for one type of layers and B containing 5 at. % of N for the other type of layers, multilayer films having a repeated structure of these two layers were produced by the sputtering method. The multilayer films comprising 60 pairs of Ru—N layers and B—N layers were produced while the cycle length being controlled to be 5.1 nm or 5.5 nm.

The ratio of the Ru—N thickness to the sum thickness of a single Ru—N layer and a single B—N layer was changed within a range of 10 to 90% and the correlation of the reflectance of the multilayer films with the wavelength was measured using a soft x-ray reflectance meter in the same manner as that for the example 1. In the case of 5.1 nm cycle length, the reflectance reached the maximum, which was 51%, to the soft x-ray wavelength of 100 Å when the thickness of a Ru—N layer was 45% to the cycle length just the same as that in the case of the example 18. The reflectance was relatively high, about 35% or higher, in the case the thickness of a Ru—N layer to the cycle length was in a range 30 to 60% to the cycle length and was about 45% or higher, which was extremely high to the wavelength, in the case the thickness of a Ru—N layer to the cycle length was in a range 40 to 50%. On the other hand, in the case of 5.5 nm cycle length, the reflectance reached the maximum, which was 56%, to the soft x-ray wavelength of 108 Å when the thickness of a Ru—N layer was 45% to the cycle length. The reflectance was relatively high, about 40% or higher, in the case the thickness of a Ru—N layer to the cycle length was in a range 30 to 60% to the cycle length and was about 50% or higher, which was extremely high to the wavelength, in the case the thickness of a Ru—N layer to the cycle length was in a range 40 to 50%.

EXAMPLE 21

Figure 3A:
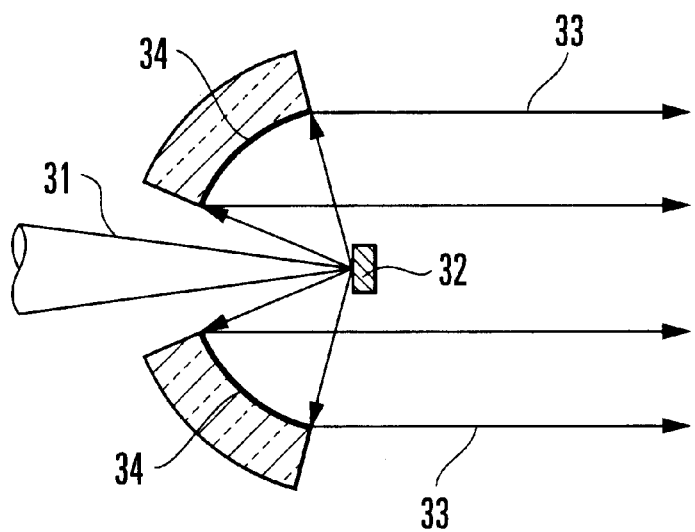
Figure 3B:
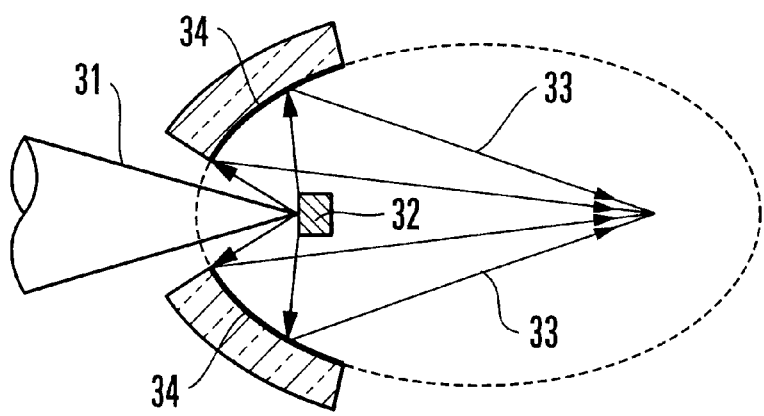
Figure 3C:
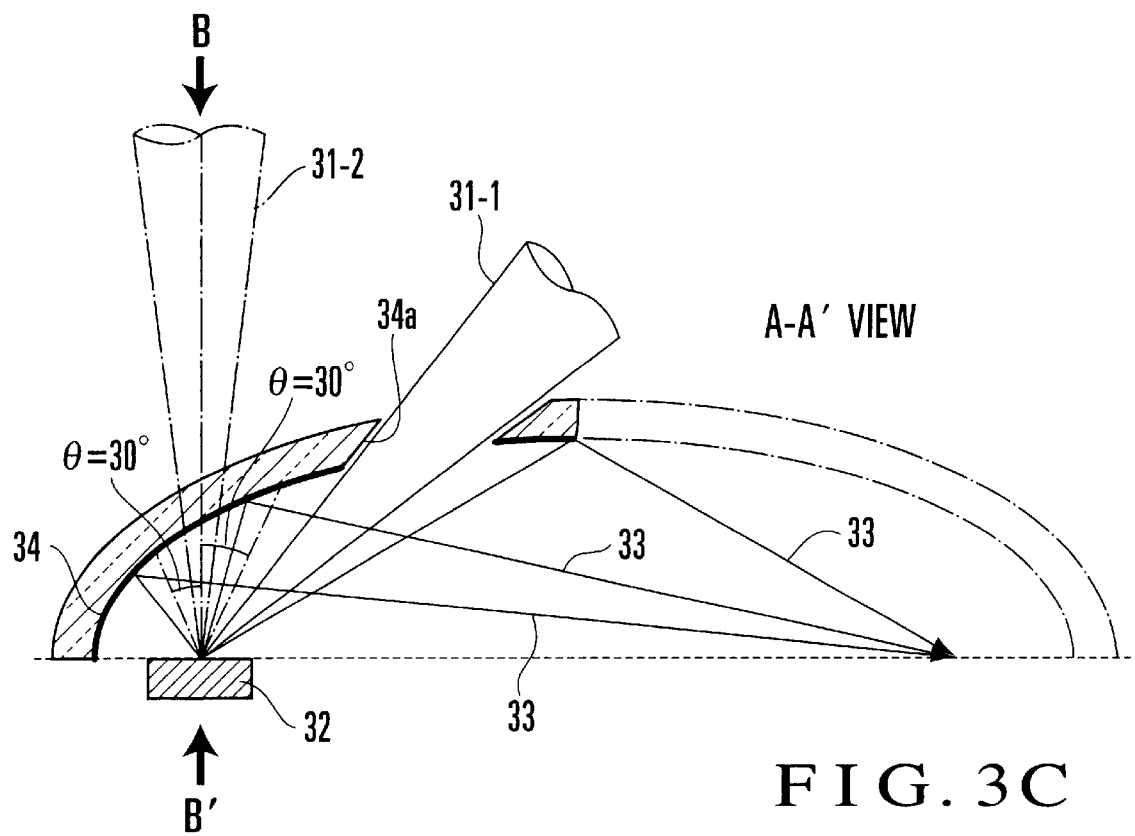
Figure 3D:
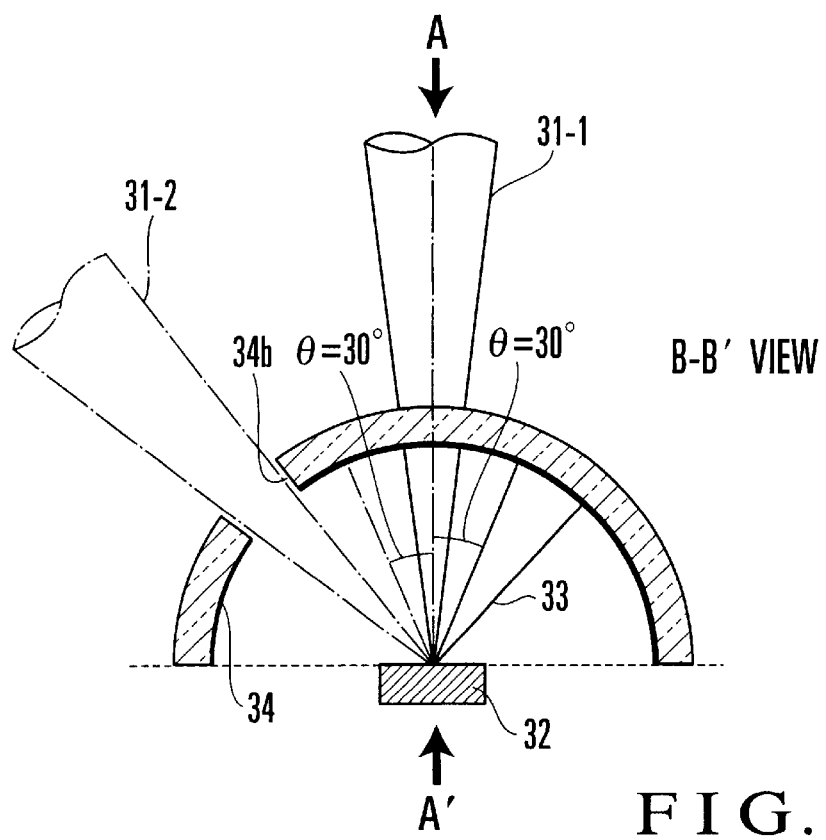

X-ray reflecting mirrors with an ellipsoid of revolution (in the present invention), which has multilayer films or Mo/Si multilayer films of the example 1 to the example 20 produced by the same manner as that of the example 1 were so arranged as to surround a cryotarget laser plasma x-ray point source (point-like x-ray generation part) 32, serving as a point-like x-ray generation part, at about several to several ten centimeter to the light source just as illustrated in FIGS. 3C and 3D to obtain high light concentration efficiency (about 3 steradian of solid angle) to the x-rays emitted out of the point source and simultaneously high reflectance (50% or higher).

In this case, the cryotarget laser plasma x-ray point source used a rare gas element, as a target material generating the x-ray, in a liquid or solid state at a low temperature or in a low temperature gas state at vapor density near the liquid density.

Since the x-ray generation efficiency of x-rays with reflected wavelength width of the foregoing multilayer film type reflecting mirrors by plasma was verified to have 1% per 1 steradian solid angle by using a pulsed laser with 500 pulses or more repeated at every several seconds, 0.5 J or higher pulse energy and about $10^{-8}$ second pulse width, a laser plasma x-ray generation apparatus capable of taking out the x-rays with uniform spectra with 3.8 W or higher average intensity as a) a parallel beam and b) a converged beam could be constituted.

Figure 3E:
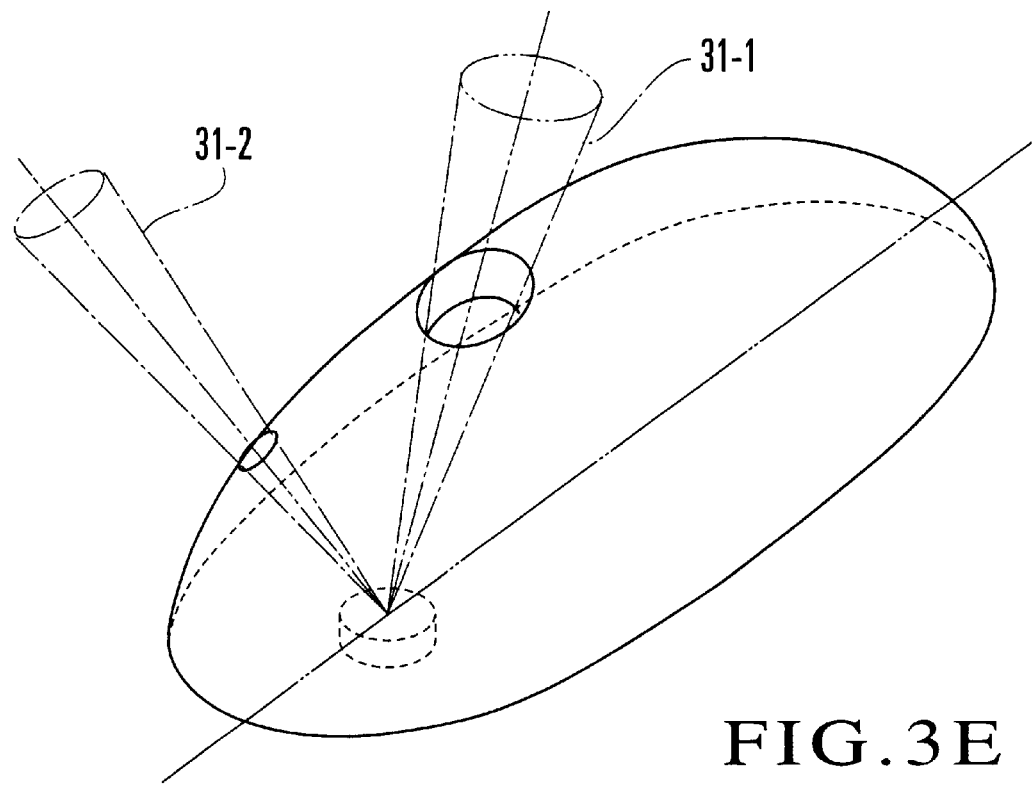

FIGS. 3C, 3D, and 3E illustrate an example of the arrangement of an ellipsoid of revolution (in the example only the upper half portion is illustrated and the lower half portion is omitted) for condensing more x-rays which are emitted from the laser plasma x-ray point source by the foregoing x-ray optical system. Assuming that θ is an angle from a normal (vertical line) to the laser target surface, the angular distribution of x-ray emission intensities is almost determined depending on the ratio of the concentrated light diameter of the pulse laser, i.e., the diameter of plasma to be generated, to the scale length of plasma expanding by heating. For example, when the concentrated light diameter is about 100 μm, if the pulse duration of the laser is about 10 nsec, the angular distribution is isotropic; and if the pulse width is 1 nsec or shorter, the angular distribution is approximately proportional to cos θ. Therefore, the reflecting mirror has a shape to ensure a reflecting surface with respect to the normal, and the aperture is arranged in a part of the reflecting surface for only the incidence of a laser ray.

FIGS. 3A and 3B are illustrated as the references to show the characteristic features of the present invention, in which FIG. 3A illustrates a ring-shaped paraboloid of revolution, and FIG. 3B illustrates a ring-shaped ellipsoid of revolution. In FIGS. 3A and 3B, 31 shows the incidence laser ray which is incident from an axial direction of the ring-shaped paraboloid of revolution or ring-shaped ellipsoid of revolution, 32 shows the target, 33 shows the emitted x-ray obtained by heating the target 32 by the incidence laser ray 31, and 34 is a reflecting mirror which generates, from x-rays emitted from near the surface of the target 32, parallel rays or converged rays obtained by converging the x-rays on or near a focal point.

FIGS. 3C, 3D, and 3E illustrate a basic constitution of a laser plasma x-ray generation apparatus using a multilayer film type x-ray reflecting mirror according to the present invention. In FIGS. 3C, 3D, and 3E, the same reference numerals as in FIGS. 3A and 3B denote the same parts. In FIGS. 3C and 3D, the reflecting mirror 34 has the structure obtained by cutting an ellipsoid with two focal points along the major axis, and the surface of the target 32 placed on one of the two focal points is heated by an incidence laser ray to generate point-like laser plasma x-rays on that focal point. The incident laser ray 31 is incident from a direction outside a range of 30° from the normal to the x-ray emitting surface of the target 32 which is placed almost parallel to the major axis of the ellipsoidal surface of the ellipsoid. The soft x-rays emitted from the x-ray emitting surface of the target 32 by the incidence laser ray 31 are bombarded against the multilayer film type reflecting mirror 34 positioned on the inner surface of the ellipsoid and are reflected by the multilayer film type reflecting mirror 34. The reflected x-rays 33 converge on or near the other focal point of the ellipsoidal surface. The light concentration efficiency defined as an amount obtained by dividing the light amount of the converged reflected x-rays 33 by the amount of all x-rays emitted from the target depends on the form of the angular distribution for emission of the x-rays from the x-ray emitting surface of the target, and can be adjusted by changing the angle of the x-ray emitting surface with respect to the major axis of the ellipsoid.

Note that 34a is an aperture formed in the reflecting mirror 34 as shown in FIG. 3C, and through the aperture 34a, the incidence laser ray 31-1 is received from the outside. FIG. 3D illustrates a cross-sectional view taken along a surface which is perpendicular to the major axis (rotation symmetry axis) in FIG. 3C and includes the point-like x-ray source. 34b is an aperture formed in the reflecting mirror 34 as shown in FIG. 3D, and through the aperture 34b, the incidence laser ray 31-2 is received from the outside. The incidence laser 31-2 is shown as another example of 31-1, these incidence laser rays do not have the incidence direction of θ<30° to the normal of the target surface, and the soft x-rays emitted from the target are emitted to θ<300 relatively intensively. Obviously, a ray source to which the present invention is applied is not limited to a soft x-ray and may be an x-ray. A laser ray is used in this example, but the present invention is not obviously limited to this as far as light is an energy beam.

Figure 3F:
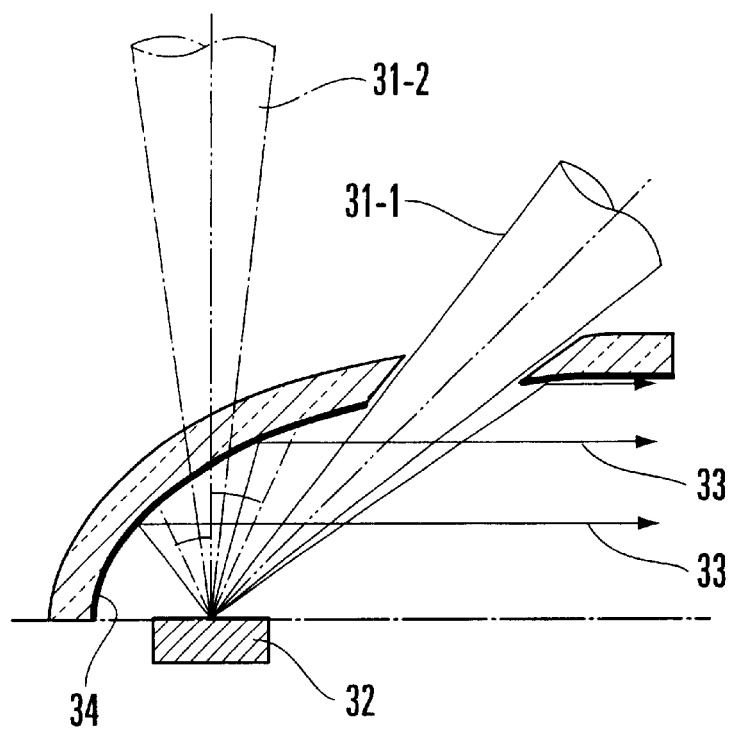

In the foregoing example, the structure obtained by cutting the ellipsoid along the major axis, i.e., an x-ray radiation part using the x-ray optical system which has 0.1 or more steradian condensing solid angle around an x-ray generation part with a target surface, and has a partial surface, as the x-ray reflecting mirror, of an ellipsoid of revolution (ellipsoidal surface) obtained by rotating an ellipse about its major axis as a rotation axis passing through the x-ray generation part by only a rotation angle of less than 180 degrees is used. However, the present invention may use a structure (e.g., the structure in FIG. 3F) in which a paraboloid of revolution serving as a source making infinity one focal point, of two focal points of an ellipse, at which the reflected x-rays converge, i.e., a source making the reflected x-rays parallel or almost parallel is defined as the x-ray reflecting mirror. This paraboloid of revolution with the foregoing structure has an x-ray optical system having a partial surface, as an x-ray reflecting mirror, of the paraboloid of revolution obtained by rotating the paraboloid of revolution about its major axis as a rotation axis by only a rotation angle of less than 180 degrees.

Further, when a Mo/Si multilayer film is used, 2 to 20% of C are added to either of the layers, so that the reflecting mirror with excellent heat resistance can be obtained according to the finding of the present inventors.

As is understood from the embodiment shown in FIGS. 3C to 3F, the portion of the reflecting mirror of the x-ray radiation part in the second focal direction is cut to have a shape so as to introduce the reflected x-rays to the outside. However, the x-ray radiation part may have any shape if reflected x-rays are guided outside, as in the case wherein the aperture for introducing the incidence ray to the inside is formed in the reflecting mirror. An aperture may be formed to guide the x-rays outside.

As described above, the multilayer films of the present invention could improve the direct incidence reflectance by using materials with optical constants suitable for giving a high reflectance to wavelength within a range from 69.5 Å to 124 Å, selecting the structure, and smoothing the interfaces. Further, the heat resistance of the multilayer film was improved by using compounds or mixtures having optical constants suitable for heightening the reflectance and giving excellent heat resistance. Consequently, as compared with a conventionally invented Mo/Be multilayer film type reflecting mirror, the multilayer film type mirrors of the present invention had heightened direct incidence reflectance or improved heat resistance or improved values of both. In the case a multilayer film with heightened reflectance is used (1) for various analysis methods using x-rays and soft x-rays, the sensitivity and the precision can be improved and in the case of use (2) for x-ray lithography, the throughput can be improved more than that of a multilayer film comprising Mo for one type of layers.

Moreover, in the case a multilayer film type x-ray reflecting mirror with heightened reflectance is used (1) for various analysis methods using x-rays and soft x-rays, the sensitivity and the precision can be improved since the alteration of the reflectance during the use is suppressed as compared with that of a conventional multilayer film type reflecting mirror owing to the more improved heat resistance than that of the conventional reflecting mirror and in the case of use (2) for x-ray lithography, the proper exposure time can precisely be determined for the same reason as the reason of (1) and further the life of the multilayer film type reflecting mirror itself can be prolonged.

In this description, materials and structures suitable for near 114 Å wavelength were exemplified, and no need to say, the reflection peak wavelength can be changed by changing the cycles according to the Bragg approximation. Also, that a high reflectance in a range from approximately the absorption edge (69.5 Å) of B to approximately the absorption edge (123 to 125 Å) of Si or to the longer wavelength could be obtained in the case of combination of a compound B and Be with a metal was exemplified by combining Mo with the compounds of B and Be such as $B_6Be$ and that was only one example, and it is also needless to say that the same effect can be obtained by using any one of Ru, Rh and Mo, or using their alloys, or using substances containing any one of these metals together with additives of other elements, or using alloys containing two or more of these metals together with additives of other elements, or further by using compounds or mixtures of B and Be such as BBe instead of $B_6Be$. Especially, when the Mo/Si multilayer films or the Mo-/Si-based multilayer films with improved heat resistance are used as the materials of the multilayer films, the same effect can be obtained in the long wavelength region over the absorption edge (123 to 125 Å) of Si or longer.

By installing or combining x-ray optical system comprising an x-ray reflecting mirror or a plurality of x-ray reflecting mirrors having the foregoing multilayer films in the periphery of a cryotarget laser plasma x-ray point source, a constituted x-ray generation apparatus can be a compact and practical apparatus capable of generating the x-ray parallel beam, or converged beam, or condensed beam with uniform spectra and high average intensity. Owing to actualization of such an x-ray generating apparatus, applied appliances for x-ray reduction projection exposure and an x-ray beam processing apparatus can be made available for practical use.

What is claimed is:

1. An x-ray generation apparatus comprising
an x-ray reflecting mirror formed on an inner surface of a concave aspheric surface, and
an x-ray generation part for receiving at least one incident energy beam,
wherein said x-ray generation part is arranged near a focal point including a focal point of a paraboloid, and
said x-ray reflecting mirror has at least one aperture formed in a position except for a part of the concave aspheric surface crossing an axis including the focal point of the concave aspheric surface, and an incident energy beam irradiates said x-ray generation part through the aperture.

2. An x-ray generation apparatus as set forth in claim 1, wherein
the energy beam is a laser ray.

3. An x-ray generation apparatus as set forth in claim 1, wherein
said x-ray generation part has a target surface which forms an angle of not more than 45° degrees with respect to the axis.

4. An x-ray generation apparatus as set forth in claim 3, wherein
the incident energy beam is guided with respect to the target surface through the aperture in a direction outside a range of 30 degrees with respect to a normal to the target surface.

5. An x-ray generation apparatus as set forth in claim 1, wherein
the aspheric surface of said x-ray reflecting mirror has a structure in which at least two kinds of a plurality of layers are layered in a plurality of times, and
said x-ray reflecting mirror uses layers containing at least one of Rh, Ru and Mo and layers containing at least one of Si, B, Be, and Be compounds as constituent materials.

6. An x-ray generation apparatus as set forth in claim 5, wherein
the constituent materials of said x-ray reflecting mirror are materials for soft x-rays with a wavelength range from 69.5 Å to 140 Å.

7. An x-ray generation apparatus as set forth in claim 1, wherein
said x-ray generation part uses, as a target material for generating x-rays, a cryotarget in which a rare gas is kept at a low temperature.

8. An x-ray generation apparatus as set forth in claim 7, wherein
the rare gas is in a liquid state.

9. An x-ray generation apparatus as set forth in claim 7, wherein
the rare gas is in a solid state.

10. An x-ray generation apparatus as set forth in claim 7, wherein
the rare gas is in a low temperature gas state having vapor density close to liquid density.

11. An x-ray generation apparatus as set forth in claim 1, wherein
said x-ray reflecting mirror uses as an x-ray radiation part an x-ray optical system comprising reflecting curvature mirrors having 0.1 or higher steradian condensing solid angle around said x-ray generation part.

12. An x-ray generation apparatus as set forth in claim 5, wherein
the aspheric surface of said x-ray reflecting mirror is a multilayer film comprising one layer of Mo and another layer of one component selected from the group consisting of Si, B, Be, and Be compounds, and a thickness of the Mo layer falls within a range from 30% to 60% a repeated cycle length of the multilayer film.

13. An x-ray generation apparatus as set forth in claim 12, wherein
one of the B, Be, and Be compounds in another layer is selected from the group consisting of BBe, $B_2Be$, and $B_6Be$.

14. An x-ray generation apparatus as set forth in claim 12, wherein
a thickness of Si, B, Be, and Be compounds is 30% to 80% the cycle of the structure repeated in a plurality of times.

15. An x-ray generation apparatus as set forth in claim 5, wherein
2 to 20 at. % of C, B, N, or O are added to at least one layer of the plurality of layers.

16. An x-ray generation apparatus as set forth in claim 5, wherein
the Be compound contains at least one of Ca, Co, Fe, Mo, Nb, Ti, V and W.

17. An x-ray generation apparatus as set forth in claim 5, wherein
the layers containing at least one of Rh and Ru are alloy layers of either Mo alloyed with Rh or Mo allayed with Ru each having the composition ratio of Rh or Ru to Mo within a range from 30% to 70% and the thickness of each alloy layer within a range from 30% to 70% a cycle of the repeated layers.

18. An x-ray generation apparatus as set forth in claim 5, wherein
the layers containing at least one of Rh and Ru are alloy layers of Rh and Ru having the composition ratio of Rh to Ru within a range from 30% to 70%, and a thickness of each allay layer within a range from 10% to 60% a cycle of the repeated layers.

19. An x-ray generation apparatus as set forth in claim 5, wherein
the aspheric surface of said x-ray reflecting minor is a multilayer film comprising one layer of Mo and another layer of one of B, Be and Be compounds, and a thickness of the Mo layer falls within a range from 30% to 60% a repeated cycle length of the multilayer film.

20. An x-ray generation apparatus as set forth in claim 5, wherein
the layers containing at least one of Rh and Ru are layers of Ru, and a thickness of the Ru layers falls within a range from 30% to 70% to a cycle.

21. An x-ray generation apparatus as set forth in claim 5, wherein
the layers containing at least one of Rh and Ru are layers of Rh, and a thickness of the Rh layers falls within a range from 30% to 70% to a cycle.

22. An x-ray generation apparatus as set forth in claim 1, wherein
the aspheric surface is elliptical and has an x-ray radiation part for taking out an x-ray from said x-ray generation part with a target surface to the outside, said x-ray radiation part having 0.1 steradian condensing solid angle around said x-ray generation part, and including an x-ray optical system in which a partial surface of an ellipsoid of revolution obtained by rotating an ellipse about a major axis thereof as a rotation axis passing through said x-ray generation part by a rotation angle of less than 180 degrees is defined as said x-ray reflecting mirror, said x-ray generation part is located near a focal point including one of focal points of the ellipsoid of revolution, a normal of the target surface includes the rotation axis and is included on a plane located at a position corresponding to a half of the rotation angle, said x-ray reflecting mirror has a multilayered structure in which at least two kinds of a plurality of layers are stacked in a plurality of times, and constituent materials of said x-ray reflecting mirror include a layer containing at least one of Rh, Ru, and Mo and a layer containing at least one of Si, B, Be, and Be compounds.

23. An x-ray generation apparatus as set forth in claim 1, wherein the aspheric surface comprises a paraboloid, and said apparatus further comprises an x-ray radiation part for taking out an x-ray from said x-ray generation part with a target surface to the outside, said x-ray radiation part having 0.1 steradian condensing solid angle around said x-ray generation part and including an x-ray optical system in which a partial surface of a paraboloid of revolution obtained by rotating the paraboloid of revolution about a major axis thereof as a rotation axis passing through said x-ray generation part by a rotation angle of less than 180 degrees is defined as said x-ray reflecting mirror, wherein said x-ray generation part is located near a focal point including one of focal points of the paraboloid of revolution, a normal of the target surface includes the rotation axis and is included on a plane located at a position corresponding to a half of the rotation angle, said x-ray reflecting mirror has a multilayered structure in which at least two kinds of a plurality of layers are stacked in a plurality of times, and constituent materials of said x-ray reflecting mirror include a layer containing at least one of Rh, Ru, and Mo and a layer containing at least one of Si, B, Be, and Be compounds.

* * * * *